(12) United States Patent
Peters et al.

(10) Patent No.: US 6,558,879 B1
(45) Date of Patent: May 6, 2003

(54) PHOTORESIST STRIPPER/CLEANER COMPOSITIONS CONTAINING AROMATIC ACID INHIBITORS

(75) Inventors: Darryl W. Peters, Stewartsville, NJ (US); Floyd L. Riddle, Hellertown, PA (US)

(73) Assignee: Ashland Inc., Dublin, OH (US)

( * ) Notice: Subject to any disclaimer, the term of this patent is extended or adjusted under 35 U.S.C. 154(b) by 0 days.

(21) Appl. No.: 09/668,929

(22) Filed: Sep. 25, 2000

(51) Int. Cl.[7] .............................. G03F 7/42; C11D 9/00; C11D 3/00; C23G 1/02
(52) U.S. Cl. ............................. 430/331; 134/3; 134/39; 134/40; 430/329; 510/176; 510/255; 510/258; 510/259
(58) Field of Search .................................. 430/329, 331; 510/176, 255, 258, 259; 134/3, 39, 40

(56) References Cited

U.S. PATENT DOCUMENTS

| | | | | |
|---|---|---|---|---|
| 5,209,858 A | * | 5/1993 | Heinsohn et al. | 510/176 |
| 5,308,745 A | * | 5/1994 | Schwartzkopf | 430/329 |
| 5,707,947 A | * | 1/1998 | Ward et al. | 510/255 |
| 6,033,993 A | * | 3/2000 | Love et al. | 510/255 |
| 6,268,323 B1 | * | 7/2001 | Honda et al. | 510/176 |

* cited by examiner

Primary Examiner—Richard L. Schilling

(57) ABSTRACT

A stripping and cleaning composition for the removal of residue from metal and dielectric surfaces in the manufacture of semi-conductors and microcircuits. The composition is an aqueous system including organic polar solvents including corrosive inhibitor component from a select group of aromatic carboxylic acids used in effective inhibiting amounts. A method in accordance with this invention for the removal of residues from metal and dielectric surfaces comprises the steps of contacting the metal or dielectric surface with the above inhibited compositions for a time sufficient to remove the residues.

6 Claims, 2 Drawing Sheets

PHOTORESIST STRIPPER/CLEANER COMPOSITIONS CONTAINING AROMATIC ACID INHIBITORS

BACKGROUND OF THE INVENTION

1. Field of the Invention

The present invention relates to stripping and cleaning compositions for the removal of residue from metal or dielectric surfaces in the manufacture of semi-conductors and microcircuits. More particularly, the invention provides a novel inhibition system which prevents corrosion of the metal and redeposition of residue on the substrate.

2. Description of the Prior Art

Conventionally in the manufacture of semi-conductors and microcircuits after the etching step, the residual etchants and photoresists must be removed without corroding or dulling the surface of the metallic circuitry or chemically altering the substrate.

Resist stripping and cleaning agents comprising mixtures of aromatic solvents and basic amines are known. While these resist stripping agents are effective in removing the photoresist residues, they also tend to corrode the metal or metal alloy conductor such as copper, aluminized silicon dioxide and/or titanium. It has been proposed in some stripping compositions to employ hydrogen fluoride to reduce the rate of metal corrosion However, hydrogen fluoride attacks titanium metal, requires careful handling by personnel and creates disposal problems. Moreover, commercially available photoresist stripping compositions have required unduly long residence times or repeated applications in order to remove certain coatings. In addition, various coatings have resisted removal from certain substrates with the available stripping compositions.

As the processing size is becoming finer in sub-micron devices, i.e., more transistors/cm$^2$, the etching conditions and the necessity to remove post etch residues become more critical. The photoresist becomes more susceptible to damage and more difficult to remove under the more stringent conditions. Thus, stripping/cleaner formulations must be improved including providing more efficient corrosion inhibitors. Known metal corrosion inhibitor additives (i.e. phenol derivatives such as catechol, pyrogallol, gallic acid, resorcenol, and beta-naphthol) glucose and azoles such as, benzotriazole etc., in semiconductor stripper-cleaners in semi-aqueous solvent blends, do not maintain an acceptable level of corrosion inhibition in the presence of high levels of water. With conventional inhibitors exceeding about 25 weight percent water results in unacceptable corrosion rates for aluminum, aluminum alloys and copper. Semiconductor device performance and yield are strongly dependent on maintaining the designed line width. Unacceptable line width loss results in yield loss. Higher levels of water improve the removal rate of etch inorganic residue, however, this had to be balanced against line width loss.

U.S. Pat. Nos. 5,496,491, 5,556,482 and 5,707,947 to Ward, et al., which are herein incorporated by reference, disclose organic stripping compositions for photoresists comprising organic polar solvents and basic amines which include inhibitors which form coordination complexes with the metal. The corrosion inhibitors disclosed are phenol derivatives are weak acids which deprotonate in solutions with a pH about 9 forming mono- and di-anions which can chelate with metal cations, forming stable five, six and seven membered rings.

Benzoic acid and substituted benzoic acids have been studied as interfacial corrosion inhibitors for copper in perchloric acid ($HClO_4$), R. K. Dinoppa and S. M. Mayanna, Journal Of Applied Electrochemistry, 11 (1981) p. 111–116 but never tested in the field of stripper/cleaner compositions for the removal of photoresists from semiconductors and microcircuitry elements.

There exists a need to provide a photoresist stripping/cleaning composition which provides improved corrosive prevention to metals and metal alloys, as well as, efficient and substantially complete removal of a wide variety of organic polymeric photoresist and inorganic materials while being chemically inert to the substrate.

SUMMARY OF THE INVENTION

In accordance with the present invention there is provided aqueous acidic and basic stripping and cleaning compositions useful in the semiconductor or microcircuitry industry for removing photoresists and other residues having improved corrosion inhibition, are useful in acidic. stripping and cleaning compositions, are free of oxidants.

The inhibitors which are employed in the stripping and cleaning compositions of this invention are a unique group of aromatic carboxylic acids and their derivatives selected from ammonium benzoate, benzoic acid, phthalic acid, phthalic anhydride, isophthalic acid and mixtures thereof in an effective corrosion inhibiting amount.

Advantageously, the photoresist stripping and cleaning compositions which comprise water basic amines include alkanol-amines, hydroxylamines and mixtures thereof. The compositions of he invention are particularly useful for removing inorganic residues on metal or dielectric substrates.

It is an object of this invention to provide improved stripping and cleaning compositions which effectively and efficiently remove residues from subsrates without redeposition.

It is another object of this invention to provide an improved stripping and cleaning compositions which is not corrosive to either metals, metal alloys or dielectric substrates.

It is still another object of the present invention to provide a stripping and cleaning composition which inhibits redeposition of metal ions.

It is a further object of the present invention to provide a corrosion inhibitor which effectively can be used in basic or acidic stripping and cleaning compositions.

It is still a further object of the present invention to provide a corrosion inhibitor for stripping and cleaning compositions which maintain an improved level of corrosion inhibition in the presence of high levels of water.

Yet another object of the present invention is to provide corrosion inhibitors for semi-aqueous photoresist stripping and cleaning compositions which are less expensive and are effective at low concentrations and low temperatures.

Yet a still object of the present invention is to provide an aqueous stripping and cleaning composition for aluminum and copper foils which have a high cleaning efficiency in aqueous formulations with reduced toxicity.

DETAILED DESCRIPTION OF THE PREFERRED EMBODIMENTS

Figure 1:
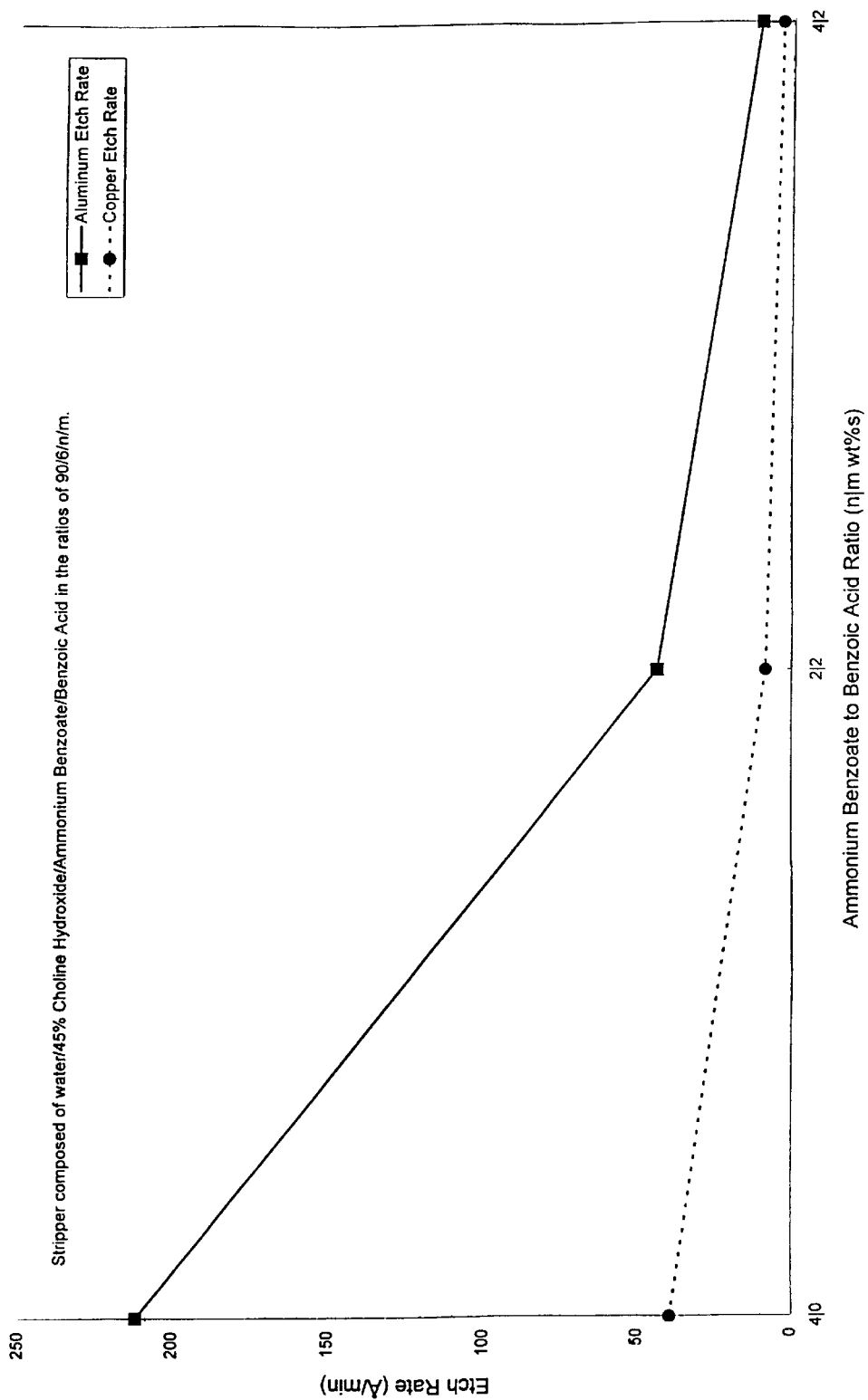
FIG. 1 shows corrosion inhibitor efficiency curves for a water/45% choline hydroxide stripper composition matrix in the ratio of 90/6 n/m and the inhibiting effect of various ratios of ammonium benzoate and benzoic acid on aluminum and copper metal foils at 20° C.

According to the present invention, there are provided novel stripper and/or cleaning compositions containing corrosion inhibitors selected from specific aromatic carboxylic acids, their derivatives and mixtures thereof useful in the sub-micron procession of semiconductors. The corrosion inhibitors of invention have a pKa values equal to or less than 4.19.

The preferred inhibitors of the invention are benzoic acid, ammonium benzoate, phthalic acid, phthalic anhydride and isophthalic acid. The use of anhydrides in basic, semi-aqueous solvent blends will result in the formation of the acid, in situ.

Corrosion inhibitors may be used in amounts of from about 0.2 to about 15 weight percent and can be added to the stripping and/or cleaning compositions. Preferably, the inhibitor concentration are from about 2 to 8 weight, percent, and more preferably from about 3 to about 5 weight percent, and most preferable from about 3 to about 5 weight percent. These percentages are based on the total stripping and cleaning composition weight.

The corrosion inhibitors of this invention are at least water miscible and are effective in stripping and cleaning compositions which exceed 25 weight percent water. In fact stripping and cleaning compositions having water contents from about 25 to about 95 weight percent can be tolerated without any fall-off in corrosion inhibition performance for aluminum, aluminum alloys and copper.

The organic polar solvents which are components in the stripper and/or cleaning compositions of the present invention encompasses a broad class of material including N,N'-dialkylalkanoylamides, N-alkyl lactams, acetate esters of ethylene glycol ethers, acetate esters of propylene glycol ethers, aliphatic amides, heterocyclics, cyclic aliphatic sulfones, esters of dibasic acids, cyclic ketones, cyclic sulfones, esters of dibasic acids, sulfoxides, ether alcohols and mixtures thereof.

Specifically, useful solvents include N, N'-dimethyl acetamide, carbitol acetate, dimethyl adipate, monoethanolamine, tri-ethanolamine, propylene carbonate, choline hydroxide, 2-(2-amino-ethoxyethanol), dimetyhyl foramide, tetrahydrofuryl alcohol, butyl diglycol, dimethyl glutarate, isophorone, gamma-butrolactone, methyl acetoxypropane, N-methyl-2-pyrrolidone, dimethyl sulfoxide and mixtures thereof.

Other polar solvents suitable for use in the stripping and/or cleaning composition of the present invention, include ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, ethylenediamine, and ethylenetriamine. Additional polar solvents as known in the art can also be used in the composition of the present invention.

The stripping compositions of this invention may also contain, if desired, any suitable water miscible nonionic surfactant which does not affect the stripping and cleaning action, typically in an amount of about 0.1 to about 2 weight percent of the total composition.

Suitable alkanolamines for use in the present invention can be represented by the formula:

$$R_{3-n}-N[(CH_2)_mOR']_n$$

Wherein R and R' can be H or alkyl and m is 2 or 3 and n is 1, 2 or 3 and preferably have relatively high boiling points, i.e., 100° C. or above and a high flash point, i.e., 45° C. The alkanolamines are preferably water soluble and miscible with hydroxylamine.

Examples of suitable alkanolamines include monoethanolamine, diethanolamine, triethanolamine, isopropanolamine, 2-amino-1-propanol, 3-amino-1-propanol isobutanolamine, 2-amino-2-ethoxyethanol, 2-amino-2-ethoxypropanol, tripropanol amine and the like.

Various other ingredients known to those in the art may optionally be included in the stripping composition, e.g., dyes or colorants, antifoamers, etc., in an amount of about 0.1 to 0.5 weight percent.

The inhibitor utilized in the present stripper and cleaner compositions depends on whether the compositions are acid or basic. The aromatic acid anhydrides disclosed above are utilized in the acidic compositions. The inhibitors, however, are not used in acidic compositions containing an oxidizing compound.

The aqueous stripping and cleaning composition of the present invention comprises a mixture of:

a.) about 25 weight percent to about 95 weight percent water;

b.) about 1 weight percent to about 30 weight percent of an organic polar solvent; and c.) an effective amount of a corrosion inhibitor selected from ammonium benzoate, benzoic acid, phthalic acid, phthalic anhydride and isophthalic acid, said composition being free of oxidants.

The stripping and cleaning compositions may be prepared by simply mixing the components where the order addition is not critical.

The stripping compositions of this invention are especially useful and advantageous for various reasons including that the stripping compositions are water miscible, non-corrosive, non-flammable with low toxicity to humans and no stress to the environment.

Semiconductor device performance and yield are strongly dependent on maintaining the designed line width. Unacceptable line width loss results in yield loss. Higher levels of water improve the removal rate of each residue, however, this has to be balanced against line width loss. The present corrosion inhibitors work with higher levels of water. Because of the low ambient vapor pressure of the compositions they evidence substantially less evaporation than prior art compositions and are non-reactive and environmentally compatible. The stripping and cleaning compositions may be recycled for multiple use and may be easily disposed without stress to the environment and without the necessity for burdensome safety precautions.

By the same token the stripped coatings may be readily removed as solids and collected for easy disposal. The stripping and cleaning compositions of this invention evidence higher stripping efficiency at lower temperatures for a wide variety of coatings and substrates.

Representative organic polymeric materials include positive photoresists, electron beam resists, X-ray resists, ion beam resists and the like. Specific examples of organic polymeric materials include positive resists comprising phenol-formaldehyde, poly (p-vinylphenol), and novolak resins or negative resists comprising cyclized polyisoprene or polymethylmethacrylate-containing resins and the like.

The organic polymeric material can be removed from any of the conventional substrates known to those skilled in the art, such as silicon, silicon dioxide, silicon nitride, polysilicon, aluminum, aluminum alloys, copper, copper alloys, polyimides, etc.

The process of the invention comprises contacting an organic polymeric material with the disclosed stripping and cleaning composition. The process conditions, i.e., temperature, time, and duration of contact may vary over wide ranges and are generally dependent on the nature and thickness of the organic polymeric material to be removed, as well as, other factors familiar to those skilled in the art. Generally temperatures ranging from about 25° C. to about 100° C. for a contact period of about 10 minutes to about 60 minutes are typical.

A variety of means can be employed in contacting the organic polymeric material with the stripping-cleaning composition in the practice of the invention. For example, the substrate containing the organic polymeric material can be immersed in a stripping bath or the stripping-cleaning composition can be sprayed over the surface of the polymeric material as will be apparent to those skilled in the art.

The present invention is further described in detail by means of the following Example. Al parts and percentages are by weight and all temperatures are degrees Celcius unless explicitly stated otherwise.

EXAMPLE 1

A stripping and cleaning composition having controlled dielectric capabilities is prepared by mixing choline hydroxide and water at room temperatures to form a dilute base solution and then adding a corrosion inhibitor. The composition is shown in TABLE I.

TABLE I

| Component | Weight Percent |
| --- | --- |
| Deionized Water | 90 |
| Choline Hydroxide | 6 |
| Inhibitor | 4 |
|  | 100 |

EXAMPLE 2

Several inhibitors used in the composition of Example 1 comprised ammonium benzoate (AB) and various concentration ratios of ammonium benzoate (AB) and benzoic acid (BA).

FIG. 1 shows aluminum and copper corrosion inhibition efficiency curves at 20° C. for the inhibitor systems mentioned and the results are tabulated in TABLE II.

TABLE II

| | Etch Rate A/min. | |
| --- | --- | --- |
| Ratio AB/BA | Al | Cu |
| 4/0 | 225 | 40 |
| 2/2 | 50 | 18 |
| 4/2 | 10 | 4 |

As shown in FIG. 1 and TABLE II there are added benefits in corrosion inhibition efficiency, when ammonium benzoate and benzoic acid are combined, i.e., synergistic effects not attainable using the compounds alone. This is particularly the case when the ratio of ammonium benzoate is greater. There is a dramatic increase in the efficiency of aluminum corrosion inhibition and a more gradual but sustained increase in copper corrosion inhibition.

EXAMPLE 3

Figure 2:
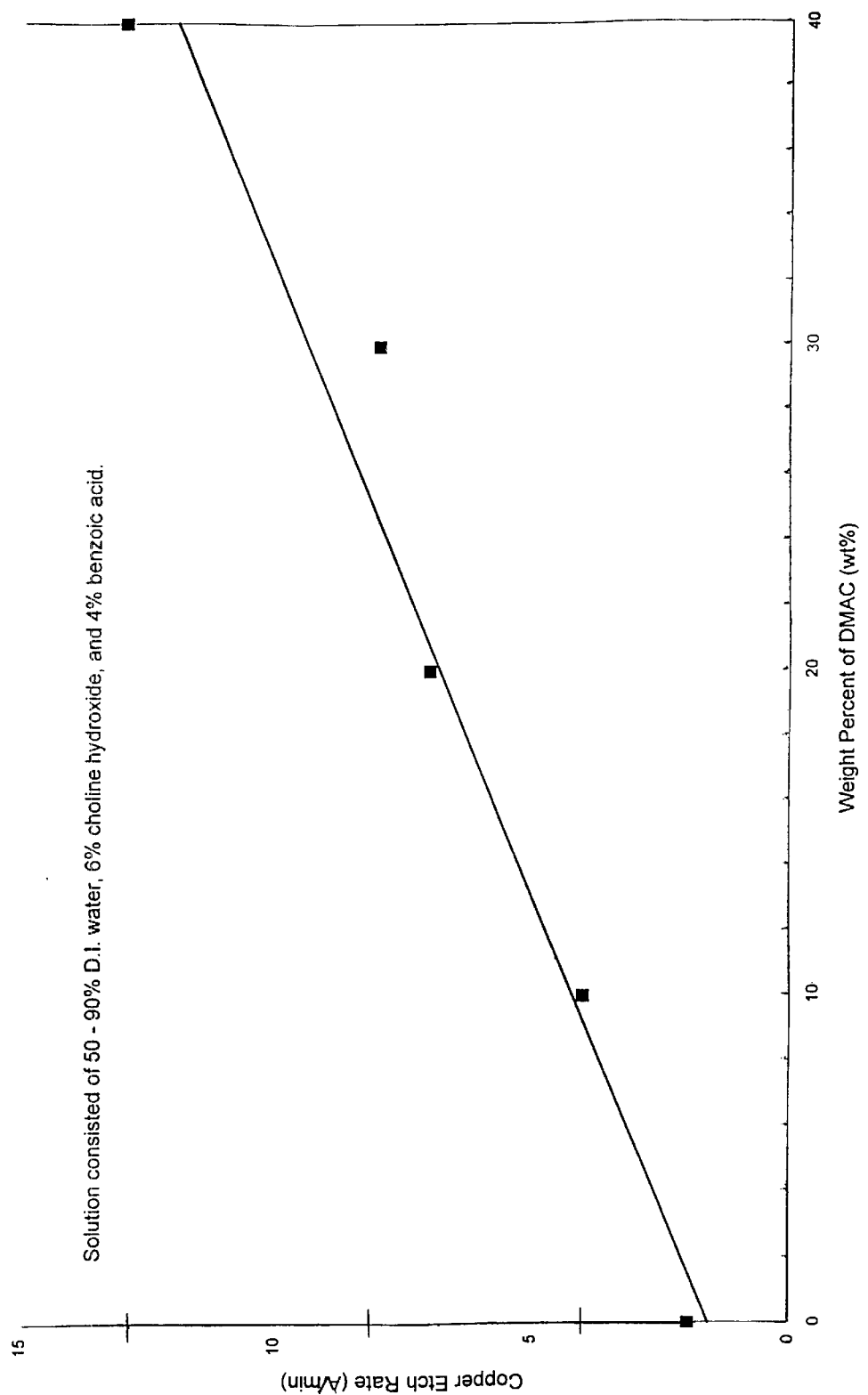
FIG. 2 shows the effect on the copper etch rate by varying the proportion of the organic polar solvent (DMAC) component in a stripper composition matrix comprising 6% (45%) choline hydroxide and 4% benzoic acid.

This example determined copper etch rates for a semi-aqueous dilute base having the general formulation of Example 1 using 4 weight percent benzoic acid as the corrosion inhibitor and additionally including varying weight percentages of N,N'-dimethylacetamide (DMAC) were conducted at 75° C. The results are shown in FIG. 2 and TABLE III.

TABLE III

| DMAC (wt. %) | D.I. H$_2$O (wt. %) | ETCH RATE (A/min) |
| --- | --- | --- |
| 0 | 90 | 1.56 |
| 10 | 89 | 3.89 |
| 20 | 70 | 6.56 |
| 30 | 60 | 7.78 |
| 40 | 50 | 12.33 |

It i noted from the resulting data, that as the amount of DMAC increases in the stripping-cleaning compositions, the copper etch rate also increases. This unexpected phenomenon is likely due to the chelation product having a higher affinity for the solution, resulting in a reduction in the corrosion inhibition efficiency.

EXAMPLE 4

A series of experimental runs were conducted to evaluate the corrosion inhibitor efficiency for aluminum and copper films of the present invention versus the known and prior art inhibitor.

To a stripping composition matrix comprising 64% N,N'-dimethylacetamide, 30% deionized water and 6% (45%) choline hydroxide were added various inhibitors. The solutions were agitated with a magnetic stirrer until the inhibitors were in solution. All test wafers contained 1200 Å° of thermal oxide underneath the metal film and were dipped into the various solutions maintained at 50° C. and agitated with a magnetic stirrer for 30 minutes, followed by a 3 minute rinse with deionized water and then dried with nitrogen gas.

Metal etch rates were determined using a Veeco FFP 5000 electrical four point probe system which determines metal film thickness through a resistivity measurement. Blanket metal films were deposited on 1200 Å° of thermal oxide on silicon wafers.

When $\Gamma$ is zero percent the inhibitor is ineffective and rapid corrosion has occurred, where $\Gamma$ is one hundred percent no corrosion has occurred. Values less than zero percent denote enhanced corrosion, probably due to increased solubility of the chelation product in the solvents tested. The results are shown in Table IV.

TABLE IV

Corrosion Inhibitor Efficiency (Γ) at 50 degrees C.
for Al and Cu Films
DMAC/H$_2$O/Choline Hydroxide Matrix

| Inhibitor | FW | pK$_a$ | Conc. (M) | Γ$_{Al}$ (%) | Γ$_{Cu}$ (%) | Conc. (M) | Γ$_{Al}$ (%) | Γ$_{Cu}$ (%) |
|---|---|---|---|---|---|---|---|---|
| 8-HQ | 145 | 9.51 | 0.069 | 50 | −307 | 0.34 | 98 | 59 |
| Catechol | 110 | 9.85 | 0.091 | 50 | 70 | 0.45 | 98 | −104 |
| Pyrogallol | 126 | ~9.80 | 0.079 | 50 | 33 | 0.40 | 99.8 | 26 |
| Gallic Acid | 170 | 4.41 | 0.059 | 50 | 0 | 0.29 | 99.9 | −3 |
| Benzotriazole | 119 | — | 0.084 | 10 | 26 | 0.42 | 100 | 33 |
| Benzoic Acid | 112 | 4.19 | 0.082 | 50 | 78 | 0.41 | 99.9 | 44 |
| Phthalic Acid | 166 | 2.89 | 0.060 | 17 | 85 | 0.30 | 99.9 | 78 |
| Isophthalic Acid | 166 | 3.54 | 0.060 | 50 | 78 | 0.30 | 100 | 85 |
| Phthalic Anhydr. | 152 | — | 0.066 | 50 | 89 | 0.33 | 100 | 85 |

FW and pK$_a$ were from CRC tables.
= (1− ER/ER$_0$) × 100% which is a quantitative measure of the effectiveness of the inhibitor ranging from 0 to 100.
Etch rates determined for blanket films with a Veeco 5000FFP four point probe.
Solutions were run with magnetic stir agitation, 3' water rinse, and N$_2$ dry.

As noted from Table IV, all the aromatic carboxylic acids disclosed, benzoic acid, phthalic acid, isophthalic acid, and phthalic anhydride, provide an overall improved corrosion efficiency in low and high concentrations for both aluminum and copper films. When only phenolic hydroxy groups are available in the inhibitor, i.e. 8-hydroxy-quinoline, catechol and pyrogallol, a lower level of corrosion inhibitor efficiency results.

It will now be apparent to those skilled in the art that other embodiments, improvements, details and uses can be made consistent with the letter and spirit of the foregoing disclosure and within the scope of this invention, which is limited only by the following claims, construed in accordance with the statutes of the patent code, including the doctrine of equivalence.

What is claimed is:

1. In an aqueous acidic or basic stripping and cleaning composition for the removal of residues from metal, metal alloy or dielectric surfaces, said composition comprising water and an organic polar solvent, the improvement which comprises said composition having an effective amount of an aromatic carboxylic acid corrosion inhibitor, said inhibitor consisting of a mixture of benzoic acid, and ammonium benzoate said composition being free of oxidants and having a pH of less than about 4.

2. The composition of claim 1 comprising from about 0.2 to about 15 weight percent of said inhibitor.

3. The composition of claim 2 comprising from about 3 to about 5 weight percent of said inhibitor.

4. The composition of claim 1 wherein said polar solvent is N$_1$N$^1$-dimethylacetamide.

5. A basic photoresist stripping and cleaning composition comprising:
   a) cholrine hydroxide;
   b) about 2 to 6 weight percent of a mixture of ammonium benzoate and benzoic acid;
   c) about 80 to 90 weight percent water; and
   d) 0 to about 10 weight percent N, N$^1$-dimethylacetamide, wherein the ratio of ammonium benzoate and benzoic acid ranges from about 2:1 to 1:1, said composition being free of oxidants.

6. A basic photoresist stripping and cleaning composition consisting essentially of:
   a) about 10 weight percent N, N$^1$-dimethylacetamide;
   b) about 6 weight percent choline hydroxide;
   c) about 4 weight percent benzoic acid; and
   d) about 80 weight percent water,
said composition being free of oxidants.

* * * * *